US009548092B2

(12) United States Patent
Richter et al.

(10) Patent No.: US 9,548,092 B2
(45) Date of Patent: Jan. 17, 2017

(54) VOLTAGE CONTROLLED SPIN TRANSPORT CHANNEL

(71) Applicant: The National Institute of Standards and Technology, The United States of America, as Represented by the Secretary of Commerce, Washington, DC (US)

(72) Inventors: Curt Andrew Richter, Olney, MD (US); Hyuk-Jae Jang, Gaithersburg, MD (US)

(73) Assignee: The National Institute of Standards and Technology, The United States of America, as represented by the Secretary of Commerce, Washington, DC (US)

(*) Notice: Subject to any disclaimer, the term of this patent is extended or adjusted under 35 U.S.C. 154(b) by 750 days.

(21) Appl. No.: 13/690,803

(22) Filed: Nov. 30, 2012

(65) Prior Publication Data

US 2014/0153327 A1 Jun. 5, 2014

(51) Int. Cl.
  *G11C 11/14* (2006.01)
  *G11C 11/16* (2006.01)
  (Continued)

(52) U.S. Cl.
  CPC ............. *G11C 11/161* (2013.01); *G11C 11/16* (2013.01); *H01L 43/08* (2013.01); *B82Y 10/00* (2013.01);
  (Continued)

(58) Field of Classification Search
  CPC ...... G11C 11/16; G11C 11/161; H01L 27/222; H01L 43/08; H01L 29/66984
  (Continued)

(56) References Cited

U.S. PATENT DOCUMENTS 5,998,016 A 12/1999 Sasaki et al.
6,341,052 B2 1/2002 Hayashi
(Continued)

FOREIGN PATENT DOCUMENTS

JP 2012069958 4/2012

OTHER PUBLICATIONS

Yu, S., Lee, B., & Wong, H-S. P. (2012). Metal oxide resistive switching memory. In J. Wu, J. Cao, W. Han, A. Janotti & H. Jim (Eds.), Functional metal oxide nanostructures (319-335). New York: Springer. Retrieved from http://books.google.com/books?id=8kUKLoVTwwQC&pg=PA333&dq=Metal+Oxide+Resistive+Switching+Memory&hl=en&sa=X&ei=dZ2fUbaYJ6jXyAGDn4G4CQ&ved=0CDAQ6AEwAA#v=onepage&q=Metal%20Oxide%20Resistive%20Switching%20Memory&f=falses.
Yang et al. "High switching endurance in TaOx memristive devices" Applied Physics Letters, 97. 232102.
Tsuruoka et al. "Forming and switching mechanisms of a cation-migration-based oxide resistive memory" IOPScience.
(Continued)

*Primary Examiner* — Toan Le
(74) *Attorney, Agent, or Firm* — Carlson, Gaskey & Olds, P.C.

(57) ABSTRACT

A spin transport channel includes a dielectric layer contacting a conductive layer. The dielectric layer includes at least one of a tantalum oxide, hafnium oxide, titanium oxide, and nickel oxide. An intermediate spin layer contacts the dielectric layer. The intermediate spin layer includes at least one of copper and silver. The conductive layer is more electrochemically inert than the intermediate spin layer. A polarizer layer contacts the intermediate spin layer. The polarizer layer includes one of a nickel-iron based material, iron, and cobalt based material. The conductive layer and intermediate layer are disposed on opposite sides of the dielectric layer. The dielectric layer and the polarizer layer are disposed on opposite sides of the intermediate spin layer. The intermediate spin layer is arranged to form a conducting path (Continued)

through the dielectric layer configured to transport a plurality of electrons. Each of the plurality of electrons maintains a polarized electron spin.

26 Claims, 5 Drawing Sheets

(51) Int. Cl.
| | |
|---|---|
| H01L 43/08 | (2006.01) |
| B82Y 10/00 | (2011.01) |
| H01L 29/66 | (2006.01) |
| H01L 27/22 | (2006.01) |

(52) U.S. Cl.
CPC ........ *H01L 27/222* (2013.01); *H01L 29/66984* (2013.01)

(58) Field of Classification Search
USPC .................. 365/171, 158; 257/421, E29.323, 257/E21.665
See application file for complete search history.

(56) References Cited

U.S. PATENT DOCUMENTS

| | | | |
|---|---|---|---|
| 7,598,578 | B2 | 10/2009 | Nakamura et al. |
| 7,608,901 | B2 | 10/2009 | Koo et al. |
| 7,839,675 | B2 | 11/2010 | Koo et al. |
| 7,994,555 | B2 | 8/2011 | Koo et al. |
| 8,053,851 | B2 | 11/2011 | Koo et al. |
| 8,058,676 | B2 | 11/2011 | Kim et al. |
| 8,246,413 | B2 | 8/2012 | Liu et al. |
| 2008/0017843 | A1 | 1/2008 | Kaushal et al. |
| 2010/0271112 | A1 | 10/2010 | Hong et al. |
| 2011/0042648 | A1 | 2/2011 | Koo et al. |
| 2011/0194341 | A1* | 8/2011 | Gaidis et al. ................. 365/171 |
| 2012/0235112 | A1 | 9/2012 | Huo et al. |
| 2012/0236633 | A1 | 9/2012 | Saida et al. |
| 2013/0270661 | A1* | 10/2013 | Yi et al. ....................... 257/421 |

OTHER PUBLICATIONS

Garcia et al. "Ferroelectric Control of Spin Polarization" Science, vol. 327, Feb. 26, 2010, pp. 1106-1110.
Yuasa et al. "Spin-Polarized Resonant Tunneling in Magnetic Tunnel Junctions" Science, vol. 297, Jul. 12, 2002, pp. 234-237.
Yang et al. "The mechanism of electroforming of metal oxide memristive switches" IOP Publishing, Nanotechnology, pp. 1-9.
Mathon et al. "Theory of tunneling magnetoresistance in a junction with a nonmagnetic metallic interlayer" Physical Review B, vol. 60, No. 2, Jul. 1, 1999, pp. 1117-1121.
Prezioso et al. "Electrically Programmable Magnetoresistance in Multifunction Organic-Based Spin Valve Devices" Advanced Materials, pp. 1371-1375.
Wang, "Resistive-switching mechanism of transparent nonvolatile memory device based on gallium zinc oxide" Phys. Status Solidi A 209, No. 2, pp. 364-368.
Gao et al. "Oxide-Based RRAM: Unified Microscopic Principle for both Unipolar and Bipolar Switching" pp. 17.4.1-17.4.4.
Jo et al. "Nanoscale Memristor Device as Synapse in Neuromorphic Systems" NANO Letters, 2010, pp. 1297-1301.
Gergel-Hackett et al. "A Flexible Solution-Processed Memristor" IEEE Electron Device Letters, vol. 30, No. 7, Jul. 2009, pp. 706-708.
Yang et al. "A Family of Electronically Reconfigurable Nanodevices" Advanced Materials, 2009, pp. 3754-3758.
Waser et al. "Redox-Based Resistive Switching Memories—Nanoionic Mechanisms, Prospects, and Challenges" Advanced Materials, 2009, pp. 2632-2663.
Gillies et al. "Magnetic tunnel junctions with tantalum oxide barriers displaying a magnetoresistance ratio of up to 10% at room temperature" Applied Physics Letter 78, pp. 3496-3498.
Sakamoto et al. Electronic transport in Ta2O5 resistive switch:, Applied Physics Letter 91, pp. 91.092110-1-91.092110-3.
Jedema et al. "Spin injection and spin accumulation in all-metal mesoscopic spin valves" Physical Review B 67, pp. 085319-1-085319-16.
Crooker et al. "Imaging spin-polarized electron transport in semiconductors" Materials Science and Technology Division Research Highlight, Jan. 2006.

* cited by examiner

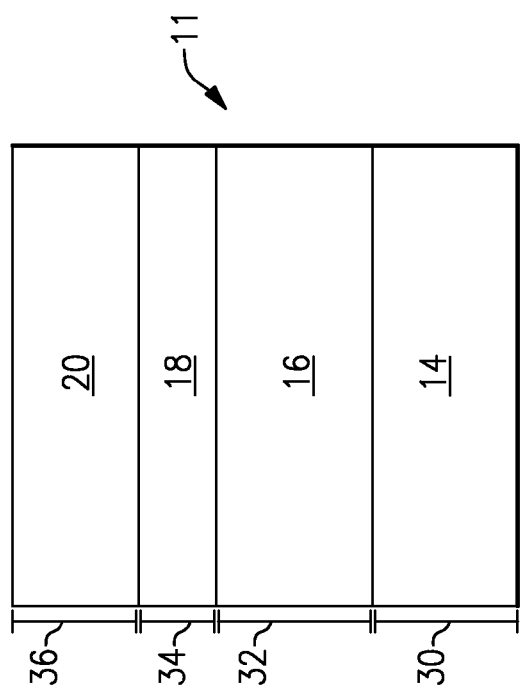
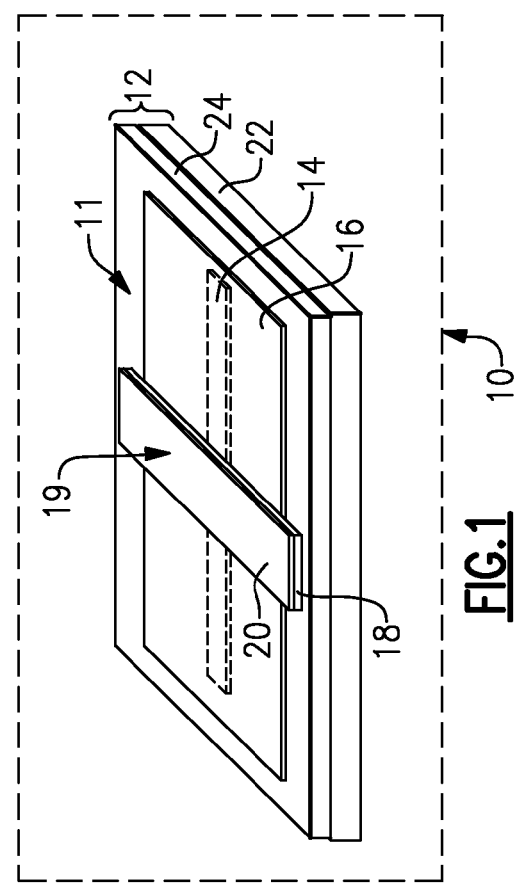

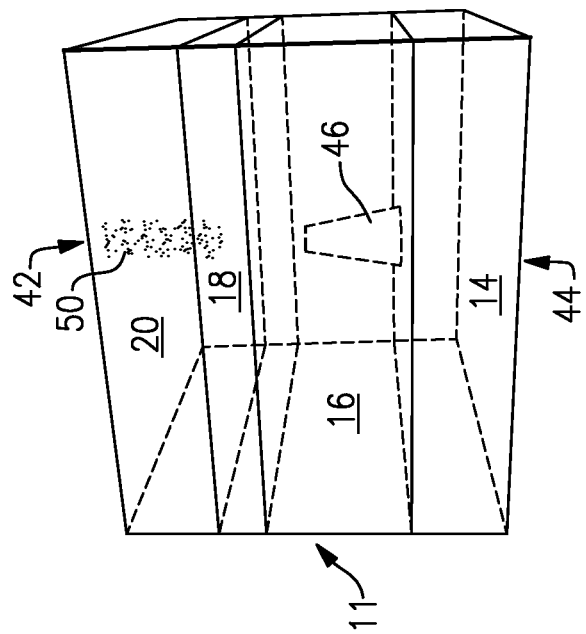
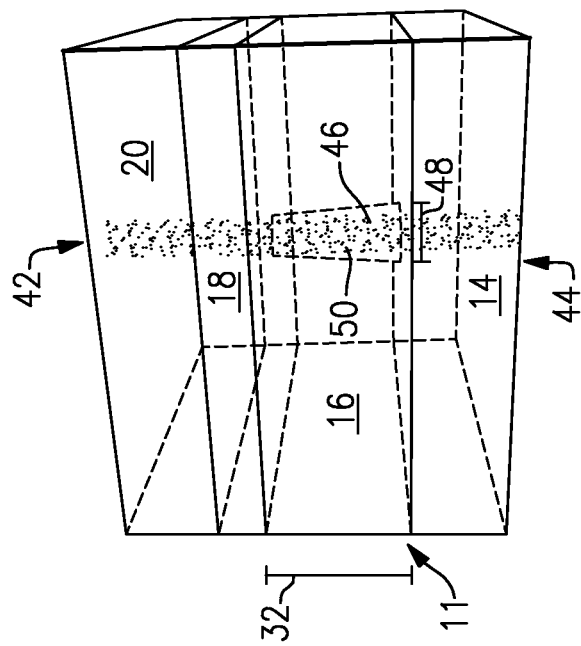

VOLTAGE CONTROLLED SPIN TRANSPORT CHANNEL

BACKGROUND

This disclosure relates to computational devices for accessing, storing and moving information, specifically an electron spin-based transport channel, component and method of using electron spin in a computational device.

Spintronics involves the use of electron spin in computing or other electronic applications and has application for use in computational devices, such as logic devices and memory devices. Electron spin is the intrinsic angular momentum associated with the electrons in one of two directions, or states. Electron spin could be used to move and store data in computing and electronic application. However, existing components do not use electron spin or do not maintain electron spin during use and transport.

SUMMARY

In one non-limiting embodiment, a spin transport channel includes a conductive layer. A dielectric layer contacts the conductive layer. The dielectric layer includes at least one of a tantalum oxide, hafnium oxide, titanium oxide, and nickel oxide. An intermediate spin layer contacts the dielectric layer. The intermediate spin layer includes at least one of copper and silver. The conductive layer is more electrochemically inert than the intermediate spin layer A polarizer layer contacts the intermediate spin layer. The polarizer layer includes one of a nickel-iron based material, iron, and cobalt based material. The conductive layer and intermediate layer are disposed on opposite sides of the dielectric layer. The dielectric layer and the polarizer layer are disposed on opposite sides of the intermediate spin layer. The intermediate spin layer is arranged to form a conducting path through the dielectric layer configured to transport a plurality of electrons. Each of the plurality of electrons maintains a polarized electron spin.

In one non-limiting embodiment, a spin transport component includes a conductive layer, a dielectric layer contacting the conductive layer, an intermediate spin layer contacting the dielectric layer, and a polarizer layer contacting the intermediate spin layer. The conductive layer and intermediate layer are disposed on opposite sides of the dielectric layer. The dielectric layer and the polarizer layer are disposed on opposite sides of the intermediate spin layer. A voltage source is electrically coupled to the spin transport channel. The intermediate spin layer forms a conducting path through the dielectric layer to transport a plurality of electrons having a respective polarized electron spin in response to a voltage from the voltage source. Each of the plurality of electrons maintains its respective polarized electron spin.

In one non-limiting embodiment, a method of using electron spin in a computational component includes providing a spin transport channel. The spin transport channel includes a conductive layer including at least one of a nickel-iron based material and a cobalt based material. The spin transport channel also includes a dielectric layer contacting the conductive layer. The dielectric layer includes a tantalum oxide. The spin transport channel also includes an intermediate spin layer contacting the dielectric layer. The intermediate spin layer includes copper. The spin transport channel also includes a polarizer layer contacting the intermediate spin layer. The polarizer layer includes at least one of a nickel-iron based material and a cobalt material. The conductive layer and intermediate layer are disposed on opposite sides of the dielectric layer. The dielectric layer and the polarizer layer are disposed on opposite sides of the intermediate spin layer. A voltage is applied to the spin transport channel. A conducting path of the intermediate spin layer is formed through the dielectric layer in response to the applied voltage. A plurality of electrons are transported through the spin transport channel via the conducting path. Each of the plurality of electrons maintains a respective polarized electron spin.

These and other features of the present disclosure can be best understood from the following specification and drawings, the following of which is a brief description.

BRIEF DESCRIPTION OF THE DRAWINGS

FIG. 1 is a perspective view of an example spin transport channel.

FIG. 2 is a cross-sectional view of an example spin transport channel.

FIG. 4a is a perspective view of the spin transport channel in an "ON" state.

FIG. 4b is a perspective view of a spin transport channel in an "OFF" state.

DETAILED DESCRIPTION

Figure 3:
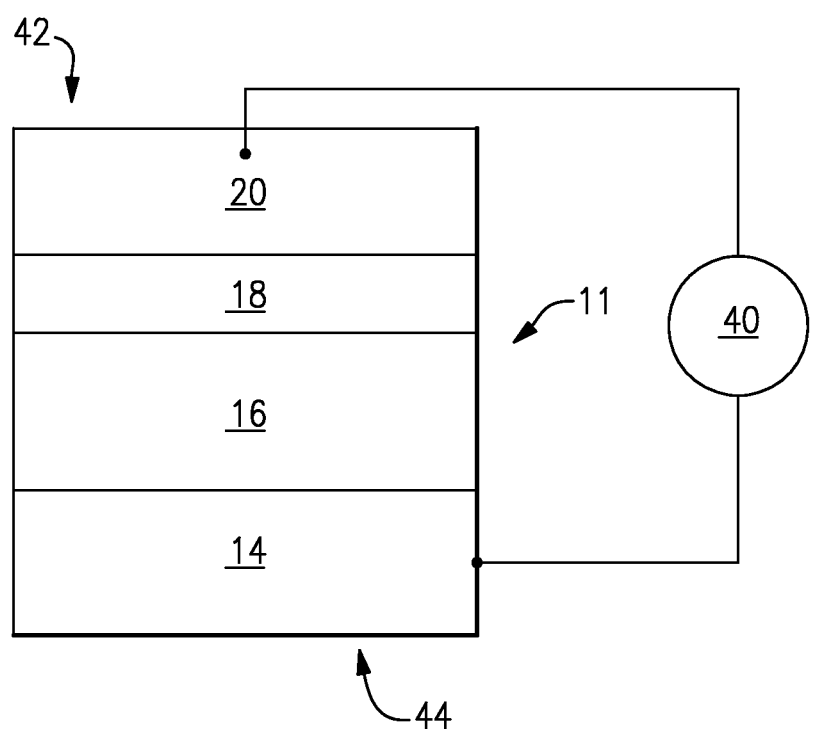
FIG. 3 is another cross-sectional view of the spin transport channel of FIG. 2 with a voltage source.

Referring to FIGS. 1 and 2, a spin transport component 10, shown schematically, includes a base 12 and a spin transport channel 11 having a conductive layer 14, a dielectric layer 16, an intermediate spin layer 18, and polarizer layer 20. The dielectric layer 16 is adjacent the conductive layer 14 and arranged such that at least a portion of the dielectric layer 16 contacts the conductive layer 14 in a stacked arrangement. The intermediate spin layer 18 is arranged adjacent the dielectric layer 16 on the side opposite of the conductive layer 14. The intermediate spin layer 18 also contacts the dielectric layer 16 in a stacked arrangement. The polarizer layer 20 is adjacent the intermediate spin layer 18 on the side opposite of the dielectric layer 16. The polarizer layer 20 contacts the intermediate spin layer 18 in a stacked arrangement. In this example, each of the conductive layer 14, dielectric layer 16, intermediate spin layer 18, and polarizer layer 20 of the spin transport channel 11 have a different geometric configuration. However, one or more of the layers 14, 16, 18, 20 of the spin transport channel 11 may have uniform geometric configurations. The stacked arrangement of the example spin transport channel 11 provides a crossbar architecture.

In this example, the spin transport channel 11 is disposed on the base 12 such that the conductive layer 14 is disposed adjacent at least a portion of the base 12. However, the spin transport channel 11 may be used without the base 12. In one example, the base 12 is a silicon (Si) or silicon dioxide ($SiO_2$) material. However, other materials are contemplated. In this example, the base 12 includes a first layer 22 of Si and a second layer 24 of $SiO_2$. However, bases 12 of a single layer, or more than two layers, of the example materials is contemplated.

In one non-limiting example, the conductive layer 14, dielectric layer 16, intermediate spin layer 18, and polarizer layer 20 have a junction area 19, or area of overlap for potential electron spin transport, is one of 10 nm×10 nm and 100 μm×100 μm. Although only one junction area 19 is shown, a plurality of junction areas 19 may be formed through the use of additional portions of the conductive layer 14, dielectric layer 16, intermediate spin layer 18, and polarizer layer 20, or through the use of different geometries of the layers 14, 16, 18, 20.

In one example, the conductive layer 14 is a material that is more electrochemically inert than the intermediate spin layer 18 such that the atoms in the conductive layer 14 are less likely to re-arrange than the atoms in the intermediate layer 18. In this example, the conductive layer 14 is a nickel-iron based material (permalloy, $Ni_{80}Fe_{15}Mo_5$), cobalt (Co) based material, or other ferromagnetic material. In another example, the conductive layer 14 is another material that is more electrochemically inert than the intermediate spin layer 18, such as a platinum based material, grapheme based material, or silicon based material. The exemplary materials may be used alone, or in combination, to form the conductive layer 14.

The dielectric layer 16 is one or more of a tantalum oxide ($TaO_x$), hafnium oxide ($HfO_x$), titanium oxide ($TiO_x$), or nickel oxide ($NiO_x$). The intermediate spin layer 18 is one or more of the Copper (Cu) or Silver (Ag). The polarizer layer 20 is one or more of a nickel-iron based material (permalloy, $Ni_{80}Fe_{15}Mo_5$), cobalt (Co) based material, iron (Fe), nickel (Ni), an alloy including one or more of the aforementioned materials, or other ferromagnetic material. In one example, the polarizer layer 20 includes a stack of ferromagnetic materials and non-ferromagnetic materials exhibiting remanent magnetization such that electrons become polarized. Although described as having at least one of the example materials, each of the conductive layer 14, dielectric layer 16, intermediate spin layer 18, and polarizer layer 20 can have only these materials, individually or in combination.

In one non-limiting example, the spin transport channel 11 includes a conductive layer 14 of $Ni_{80}Fe_{15}Mo_5$, a dielectric layer 16 of $TaO_x$, an intermediate spin layer 18 of Cu, and a polarizer layer 20 of Co. In another non-limiting example, the spin transport channel 11 includes a conductive layer 14 of Co, a dielectric layer 16 of $TaO_x$, an intermediate spin layer of Cu, and a polarizer layer 20 of $Ni_{80}Fe_{15}Mo_5$. It is contemplated that different combinations of the materials comprising each layer 14, 16, 18, 20 provided in this disclosure may be used to form the layers 14, 16, 18, 20 of the spin transport channel 11, in response to application and component requirements.

The conductive layer 14 has a thickness 30, the dielectric layer 16 has a thickness 32, the intermediate spin layer 18 has a thickness 34, and the polarizer layer 20 has a thickness 36. In one non-limiting example, the thickness 30 is greater than 5 nm, the thickness 32 is between 10 nm and 500 nm, the thickness 34 is between 1 nm and 500 nm, and the thickness 36 is greater than 5 nm. In one non-limiting example, a ratio of the thickness 34 of the intermediate spin layer 18 to the thickness 32 of the dielectric layer 16 is about 3:1. In one non-limiting example, a ratio of the thickness 32 of the dielectric layer 16 to the thickness 34 of the intermediate spin layer 18 is about 3:1. In another non-limiting example, the thickness 32 and the thickness 34 are equal.

In one example, the thickness 32 of the dielectric layer 16 is more than 3 times the thickness 34 of the intermediate spin layer 18. In another example, the ratio of the thickness 32 of the dielectric layer 16 to the thickness 34 of the intermediate spin layer 18 is greater than 3:1. In another non-limiting example, the thickness 30 is about 60 nm, the thickness 32 is about 16 nm, the thickness 34 is about 5 nm, and the thickness 36 is about 60 nm.

Referring to FIG. 3, with continued reference to FIGS. 1 and 2, a voltage source 40 is in communication with the polarizer layer 20 and conductive layer 14 of the spin transport channel 11 to provide a voltage to the spin transport channel 11. The application of voltage to the spin transport channel 11 results in electrons 50 (shown in FIGS. 4a, 4b), with polarized electron spin, to be transported from an end 42 associated with the polarizing layer to an end 44 associated with the conductive layer 14 without a randomization of the electron spin. That is, the electrons 50 are transferred through the spin transport channel 11 without changing the polarization of the electron spin or the arrangement of electron spin being transported.

In one example, the voltage applied is less than or equal to 1.5 volts.

The application of voltage to the spin transport channel 11 creates an "ON" state and an "OFF" state of the spin transport channel 11, as described in further detail below. The spin transport channel 11 can be enabled by being set in the "ON" state by applying voltage from the voltage source 40 to allow electron spin transport. The spin transport channel 11 can be disabled by applying a voltage of opposite polarity from the voltage source 40 to prevent electron spin transport. The spin transport channel 11 provides an ON/OFF resistance ratio of about $10^5$ in the spin transport component 10.

Referring to FIGS. 4a and 4b, with continued reference to FIGS. 1-3, the spin transport channel 11 is shown allowing or preventing transport of electrons 50, shown schematically, with electron spin. FIG. 4a shows the spin transport channel 11 when the voltage source 40 is set to provide an "ON" state. The "ON" state has a low resistance which allows low power consumption by the spin transport channel 11. The application of the voltage to the spin transport channel 11 causes filament growth of the intermediate spin layer 18 into the dielectric layer 16 to create a continuous conducting path 46. The conducting path 46 spans the entire thickness 32 of the dielectric layer 16. The filament growth of the intermediate spin layer 18, forming the conducting path 46, connects a first end 42 to a second end 44 such that electrons 50 with polarized electron spin are transported from the first end 42 to the second end 44 without randomization of electron spin.

As shown in FIG. 4b, when the voltage source 40 applies a voltage to set an "OFF" state, a voltage of opposite polarity is applied to the spin transport channel 11 and the conducting path 46 is annihilated such that the conducting path 46 does not span the dielectric layer 16. The annihilation of the conducting path 46 prevents the transport of electrons 50 with polarized electron spin between the first end 42 and the second end 44. The use of the voltage source 40 with the spin transport channel 11 provides an electrically controlled magnetoresistance effect to control spin information.

In this example, when the voltage source 40 is applies voltage to set an "ON" state forming the conducting path 46, the conducting path 46 has a diameter 48 equal to or less than 10 nm. Although only one conducting path 46 is shown, a plurality of conducting paths may be formed in response to the voltage based on the arrangement or geometry of the layers 14, 16, 18, 20 of the spin transport channel 11.

Existing computational devices are not voltage controlled, require higher power inputs, and are not able to use electron spin. Many of these other devices are also difficult to manufacture due to various structural arrangements required by the computational devices and other material requirements and characteristics.

Figure 5:
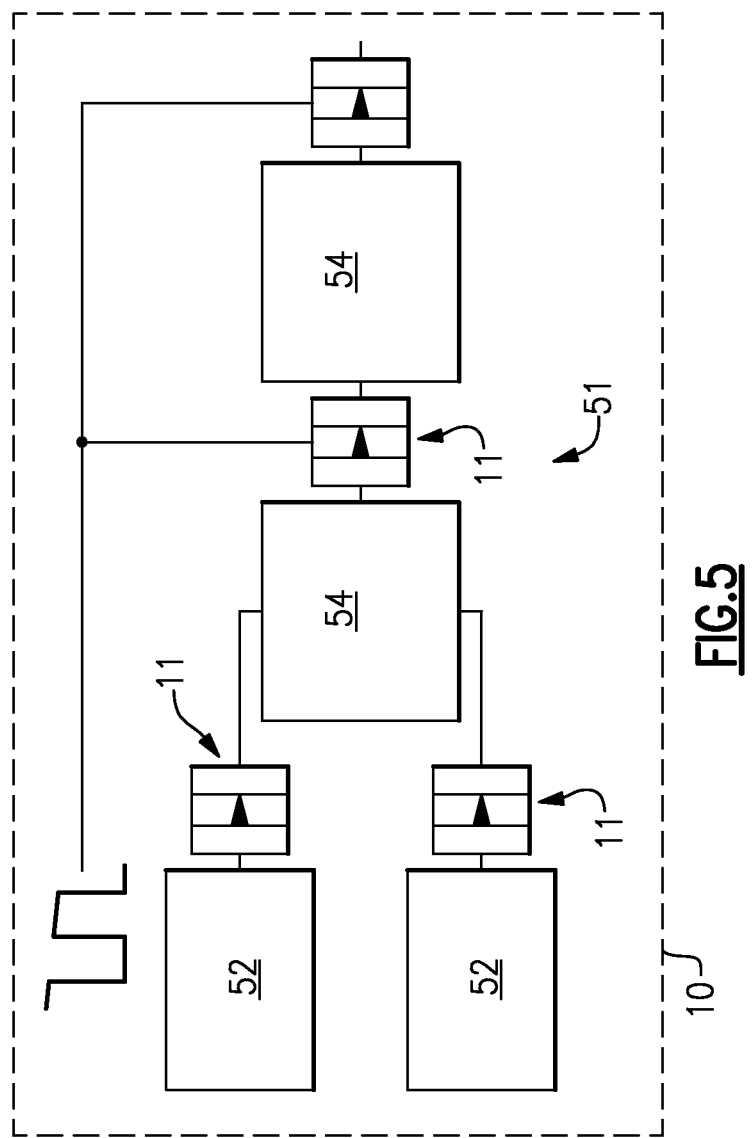
FIG. 5 is an example spin based circuit.

Referring to FIG. 5, the spin transport component 10 includes a spin based circuit 51 having at least one spin source 52, at least one spin transport channel 11, and at least one spin logic circuit 54. The spin source 52 may be a magnet or other source for effecting polarized electron spin. The electron spin generated by the spin source 52 is transferred through the spin transport channel 11, as described above, to the spin logic circuit 54 for further application. The spin transport channel 11 is used to move information via electron spin between spin logic circuits 54. The use of the spin transport channel 11 allows for a controlled transfer of information via electrons 50 with polarized electron spin, without any randomization of the electron spin which could change or interfere with the information being transported. By using the spin transport channel 11, voltage can be applied from a voltage source 40 to set the spin transport channel 11 to an "ON" state and allow the transport of electron spin corresponding to data. When information transmission needs to be stopped, the voltage source 40 provides a voltage of opposite polarity to set the spin transport channel 11 to an "OFF" state. As a result the spin transport channel 11 stops the transport of electron spin.

Figure 6:
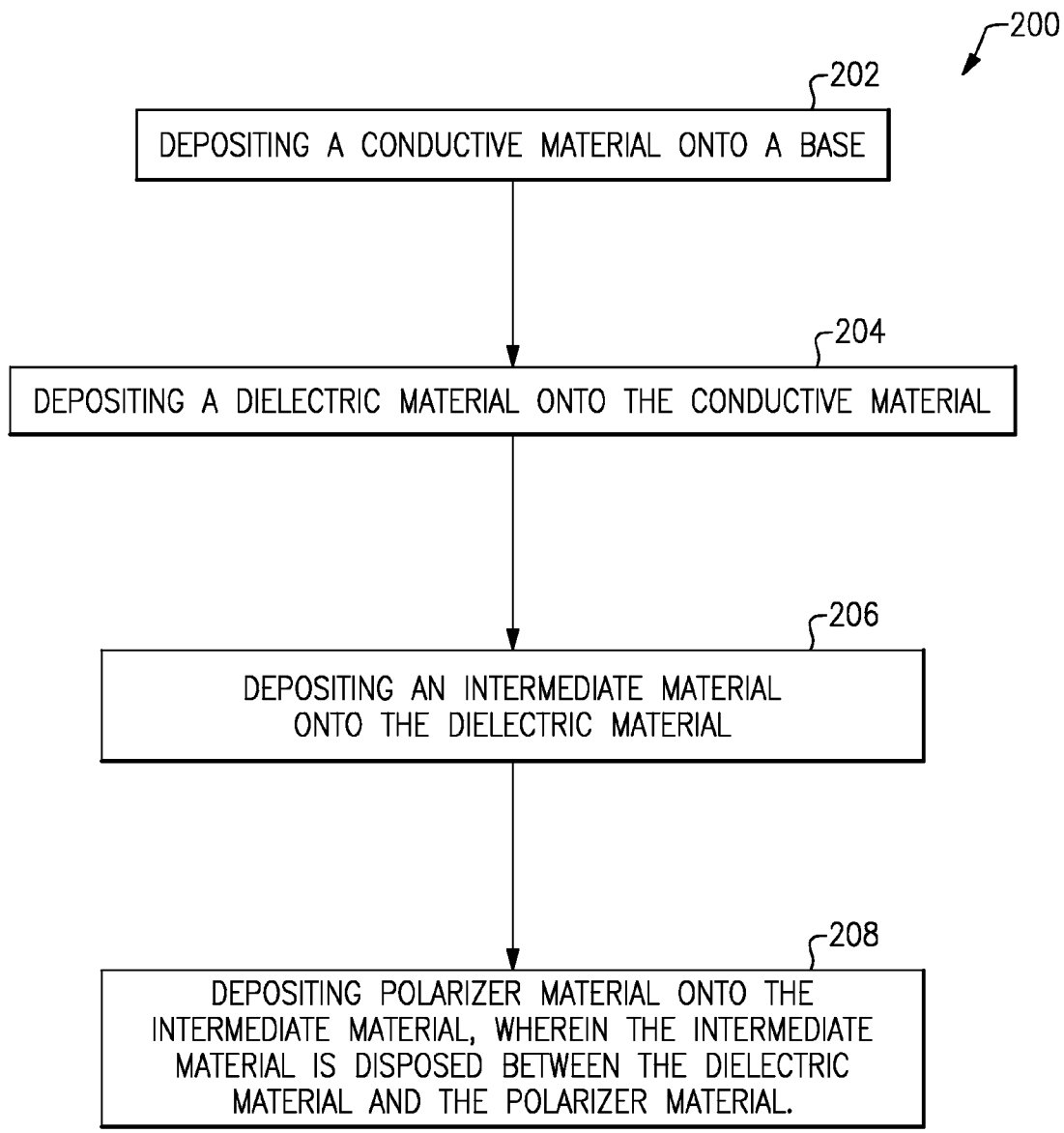
FIG. 6 is an example method of forming a spin transport channel.

Referring to FIG. 6, a method of forming an example spin transport channel 200 includes depositing a conductive material onto a base 202. A dielectric material is deposited onto the conductive material 204. A intermediate material is deposited onto the dielectric material 206 and a polarizer material is deposited on the intermediate material 208 such that the intermediate material is disposed between the dielectric material and a polarizing material. In one example, the dielectric material is TaO$_x$, the spin material is Cu, and the conducting material and polarizing material are one of a nickel-iron based material (permalloy, Ni$_{80}$Fe$_{15}$Mo$_5$) and cobalt. In one example, the conducting material and the dielectric material may each be exposed to ambient air after the step of depositing. The spin transport channel is in communication with a voltage source such that the spin transport channel is voltage controlled.

In one example, the steps of depositing a conducting material, depositing a dielectric material, and depositing a spin material and a polarizing material are done via E-beam evaporation through a shadow mask. In another example, the step of depositing the conducting material is done at a pressure of approximately $2.67 \times 10^4$ PA ($2 \times 10^{-6}$ Torr). In yet another example, the step of depositing the dielectric material is done such that the dielectric material is RF spudder-deposited under 0.4 Pa (3 MTorr) Argon (Ar) gas pressure.

Although a preferred embodiment of this disclosure has been disclosed, a worker of ordinary skill in this art would recognize that certain modifications would come within the scope of this disclosure. For that reason, the following claims should be studied to determine the true scope and content of this disclosure.

What is claimed is:

1. A spin transport channel comprising
    a conductive layer;
    a dielectric layer contacting the conductive layer, the dielectric layer including at least one of a tantalum oxide, hafnium oxide, titanium oxide, and nickel oxide;
    an intermediate spin layer contacting the dielectric layer, the intermediate spin layer including at least one of copper and silver, wherein the conductive layer is more electrochemically inert than the intermediate spin layer; and
    a polarizer layer contacting the intermediate spin layer, the polarizer layer including at least one of a nickel-iron based material, iron, and cobalt based material, wherein the conductive layer and intermediate layer are disposed on opposite sides of the dielectric layer, wherein the dielectric layer and the polarizer layer are disposed on opposite sides of the intermediate spin layer, wherein the intermediate spin layer is arranged to form a conducting path through the dielectric layer configured to transport a plurality of electrons, wherein each of the plurality of electrons maintains a polarized electron spin.

2. The spin transport channel of claim 1, wherein the conducting path forms in response to a voltage.

3. The spin transport channel of claim 1, wherein the conductive layer is Ni-80Fe15Mo5, the dielectric layer is tantalum oxide, the intermediate spin layer is copper, and the polarizer layer is cobalt.

4. The spin transport channel of claim 1, wherein the dielectric layer is thicker than the intermediate spin layer.

5. The spin transport channel of claim 1, wherein the conductive layer and the polarizer layer have an equal thickness.

6. The spin transport channel of claim 1, wherein the intermediate spin layer is arranged to annihilate the conducting path through the dielectric layer in response to a voltage.

7. The spin transport channel of claim 1, wherein a ratio of the thickness of the intermediate spin layer to the thickness of the dielectric layer is about 1:3.

8. The spin transport channel of claim 1, wherein the conducting path spans the entire thickness of the dielectric layer.

9. The spin transport channel of claim 1, wherein the conductive layer is disposed on a base comprising at least one of silicon or silicon dioxide.

10. The spin transport channel of claim 9, wherein the base includes a first layer of silicon and a second layer of silicon dioxide.

11. A spin transport component comprising
    a conductive layer;
    a dielectric layer contacting the conductive layer;
    an intermediate spin layer contacting the dielectric layer
    a polarizer layer contacting the intermediate spin layer, wherein the conductive layer and intermediate layer are disposed on opposite sides of the dielectric layer, wherein the dielectric layer and the polarizer layer are disposed on opposite sides of the intermediate spin layer; and
    a voltage source electrically coupled to the spin transport channel, wherein the intermediate spin layer forms a conducting path through the dielectric layer to transport a plurality of electrons having a respective polarized electron spin in response to a voltage from the voltage source, wherein each of the plurality of electrons maintains the respective polarized electron spin.

12. The spin transport component of claim 11, wherein the conductive layer is a Ni-80Fe15Mo5 material, wherein the dielectric layer is tantalum oxide, wherein the intermediate spin layer is copper, and wherein the polarizer layer is cobalt.

13. The spin transport component of claim 11, wherein the voltage source is electrically coupled to both the polarizer layer and the conductive layer.

14. The spin transport component of claim 11, wherein the spin transport channel is disposed on a base including a first layer of silicon and a second layer of silicon dioxide.

15. The spin transport component of claim 11, wherein the conducting path is annihilated in response to applying a voltage of opposite polarity from the voltage source to set the spin transport channel to an "OFF" state.

16. The spin transport component of claim 11, wherein a spin source and a spin logic circuit are connected to the spin transport channel.

17. The spin transport component of claim 11, wherein the conducting path formed in response to the voltage from the voltage source has a diameter of about 10 nm.

18. The spin transport component of claim 11, wherein a thickness of the conductive layer is about 60 nm, a thickness of the dielectric layer is about 16 nm, a thickness of the intermediate spin layer is about 5 nm, and a thickness of the polarizer layer is about 60 nm.

19. The spin transport component of claim 11, wherein the polarizer layer includes a stack having at least one ferromagnetic material and at least one non-ferromagnetic material.

20. The spin transport component of claim 11, wherein the conductive layer is disposed on a base comprising at least one of silicon or silicon dioxide.

21. The spin transport component of claim 11, wherein the conducting path spans the entire thickness of the dielectric layer.

22. A method of using electron spin in a computational component, the method comprising:

providing a spin transport channel including a conductive layer including at least one of a nickel-iron based material and a cobalt based material, a dielectric layer contacting the conductive layer, the dielectric layer including a tantalum oxide, an intermediate spin layer contacting the dielectric layer, the intermediate spin layer including copper, a polarizer layer contacting the intermediate spin layer, the polarizer layer including at least one of a nickel-iron based material and a cobalt material, wherein the conductive layer and intermediate layer are disposed on opposite sides of the dielectric layer, wherein the dielectric layer and the polarizer layer are disposed on opposite sides of the intermediate spin layer;

applying a voltage to the spin transport channel;

forming a conducting path of the intermediate spin layer through the dielectric layer in response to the applied voltage; and transporting a plurality of electrons through the spin transport channel via the conducting path, wherein each of the plurality of electrons maintains a respective polarized electron spin.

23. The method of claim 22, wherein the conductive layer is comprised of Ni-80Fe15Mo5, wherein the dielectric layer is comprised of the tantalum oxide, wherein the intermediate spin layer is comprised of the copper, and wherein the polarizer layer is comprised of cobalt.

24. The method of claim 22, wherein the applied voltage is equal to or less than 1.5 volts.

25. The method of claim 22, including the step of annihilating the conducting path in response to providing a voltage of an opposite polarity.

26. The method of claim 22, wherein the conducting path spans the entire thickness of the dielectric layer.

* * * * *

UNITED STATES PATENT AND TRADEMARK OFFICE
CERTIFICATE OF CORRECTION

PATENT NO. : 9,548,092 B2  
APPLICATION NO. : 13/690803  
DATED : January 17, 2017  
INVENTOR(S) : Curt Andrew Richter and Hyuk-Jae Jang Page 1 of 1

It is certified that error appears in the above-identified patent and that said Letters Patent is hereby corrected as shown below:

In the Claims

In Claim 3, Column 6, Line 16; replace "Ni-80Fe15Mo5" with --$Ni_{80}Fe_{15}Mo_5$--

In Claim 11, Column 6, Line 50; before "spin" replace "the" with --a--

In Claim 12, Column 6, Line 58; replace "Ni-80Fe15Mo5" with --$Ni_{80}Fe_{15}Mo_5$--

In Claim 23, Column 8, Line 20; replace "Ni-80Fe15Mo5" with --$Ni_{80}Fe_{15}Mo_5$--

Signed and Sealed this  
Eighteenth Day of July, 2017

Joseph Matal  
*Performing the Functions and Duties of the*  
*Under Secretary of Commerce for Intellectual Property and*  
*Director of the United States Patent and Trademark Office*